(12) United States Patent
Seyedzadehdelcheh

(10) Patent No.: US 11,496,241 B2
(45) Date of Patent: Nov. 8, 2022

(54) METHOD AND APPARATUS FOR DATA TRANSMISSION MITIGATING INTERWIRE CROSSTALK

(71) Applicant: ADVANCED MICRO DEVICES, INC., Santa Clara, CA (US)

(72) Inventor: Seyedmohammad Seyedzadehdelcheh, Bellevue, WA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 17/219,198

(22) Filed: Mar. 31, 2021

(65) Prior Publication Data

US 2022/0321258 A1 Oct. 6, 2022

(51) Int. Cl.
*H04L 1/18* (2006.01)
*H04L 1/00* (2006.01)
*H03M 13/25* (2006.01)
*H03M 13/11* (2006.01)

(52) U.S. Cl.
CPC ....... *H04L 1/0057* (2013.01); *H03M 13/1105* (2013.01); *H03M 13/1174* (2013.01); *H03M 13/251* (2013.01); *H04L 1/0041* (2013.01)

(58) Field of Classification Search
None
See application file for complete search history.

(56) References Cited

U.S. PATENT DOCUMENTS

| 8,775,143 | B2* | 7/2014 | Routh | G01V 1/28 |
| | | | | 703/2 |
| 2008/0126278 | A1* | 5/2008 | Bronstein | H04N 19/567 |
| | | | | 706/17 |
| 2015/0201404 | A1* | 7/2015 | Han | H04W 72/042 |
| | | | | 370/329 |
| 2017/0019178 | A1* | 1/2017 | Alic | H04L 25/03006 |
| 2018/0123763 | A1* | 5/2018 | Yu | H04L 5/0053 |
| 2019/0007310 | A1* | 1/2019 | Das Sharma | H04L 49/60 |
| 2021/0006351 | A1* | 1/2021 | Mueck | H03M 13/1102 |
| 2021/0050941 | A1* | 2/2021 | Das Sharma | H04L 1/203 |

OTHER PUBLICATIONS

Chang et al., "Explicit Constructions of Memoryless Crosstalk Avoidance Codes via C-transform", IEEE Transactions on Very Large Scale Integration (VLSI) Systems, vol. 22, No. 9, pp. 2030-2033, Sep. 2014, IEEE Computer Society, USA.
Duan et al., "Forbidden Transition Free Crosstalk Avoidance CODEC Design", in Proceedings 45th Annual Design Automation Conference (DAC'08), Jun. 2008, pp. 986-991, ACM New York.

(Continued)

*Primary Examiner* — Mujtaba M Chaudry

(57) ABSTRACT

Data transmission mitigating interwire crosstalk including: dividing a data block to be transmitted from a transmitter to a receiver across a set of signal wires into sub-blocks; encoding each of the sub-blocks into a plurality of codewords; selecting, for each sub-block by a cost function, one of the codewords that is less likely to introduce interwire crosstalk; transmitting the selected codewords; and updating the cost function at the transmitter with feedback from the receiver.

21 Claims, 4 Drawing Sheets

(56) References Cited

OTHER PUBLICATIONS

Jacobvitz et al., "Coset Coding To Extend The Lifetime Of Memory", 19th International Symposium on High Performance Computer Architecture (HPCA), Feb. 2013, pp. 222-233, IEEE Computer Society, USA.

JEDEC Standard, DDR4 SDRAM, Nov. 2013, 218 pages, JEDEC Solid State Technology Association, Arlington, Virginia.

Mutyam, "Preventing Crosstalk Delay Using Fibonacci Representation", in Proceedings of the 17th International Conference on VLSI Design (VLSID'04), Jan. 2004, pp. 685-688, IEEE Computer Society, USA.

Niesen et al., "Joint Crosstalk-Avoidance and Error-Correction Coding for Parallel Data Buses", IEEE Transactions on Information Theory, vol. 65, No. 3, Mar. 2019, 18 pages, IEEE Computer Society, USA.

Reed, "A Class of Multiple-Error-Correcting Codes and the Decoding Scheme", IRE Professional Group on Information Theory, vol. 4, No. 4, pp. 38-49, Sep. 1954, Lincoln Laboratory—Massachusetts Institute of Technology, Cambridge, Massachusetts.

Seyedzadeh et al., "Mitigating Bitline Crosstalk Noise in Dram Memories", in Proceedings of the International Symposium on Memory Systems (MEMSYS '17), Oct. 2017, pp. 205-216, ACM New York.

Sridhara et al., "Coding for System-on-Chip Networks: A Unified Framework", IEEE Transactions on Very Large Scale Integration (VLSI) Systems, vol. 13, No. 6, Jun. 2005, IEEE Computer Society, USA.

Sridhara et al., "Coding For Reliable On-Chip Buses: A Class Of Fundamental Bounds And Practical Codes", IEEE Transactions on Computer-Aided Design of Integrated Circuits and Systems, vol. 26, No. 5, pp. 977-982, May 2007, IEEE Computer Society, USA.

\* cited by examiner

METHOD AND APPARATUS FOR DATA TRANSMISSION MITIGATING INTERWIRE CROSSTALK

BACKGROUND

High bandwidth interconnects between compute units and memory or other units transport data. Crosstalk between adjacent wires can corrupt the data being transmitted and introduce errors. Scaling down processor technology reduces the inter-wire spacing as interconnects become shorter and wires become closer together. This considerably intensifies interaction between wires and results in crosstalk on the interconnects. Currently, a minimal number of errors can be detected and corrected.

DETAILED DESCRIPTION

Figure 1:
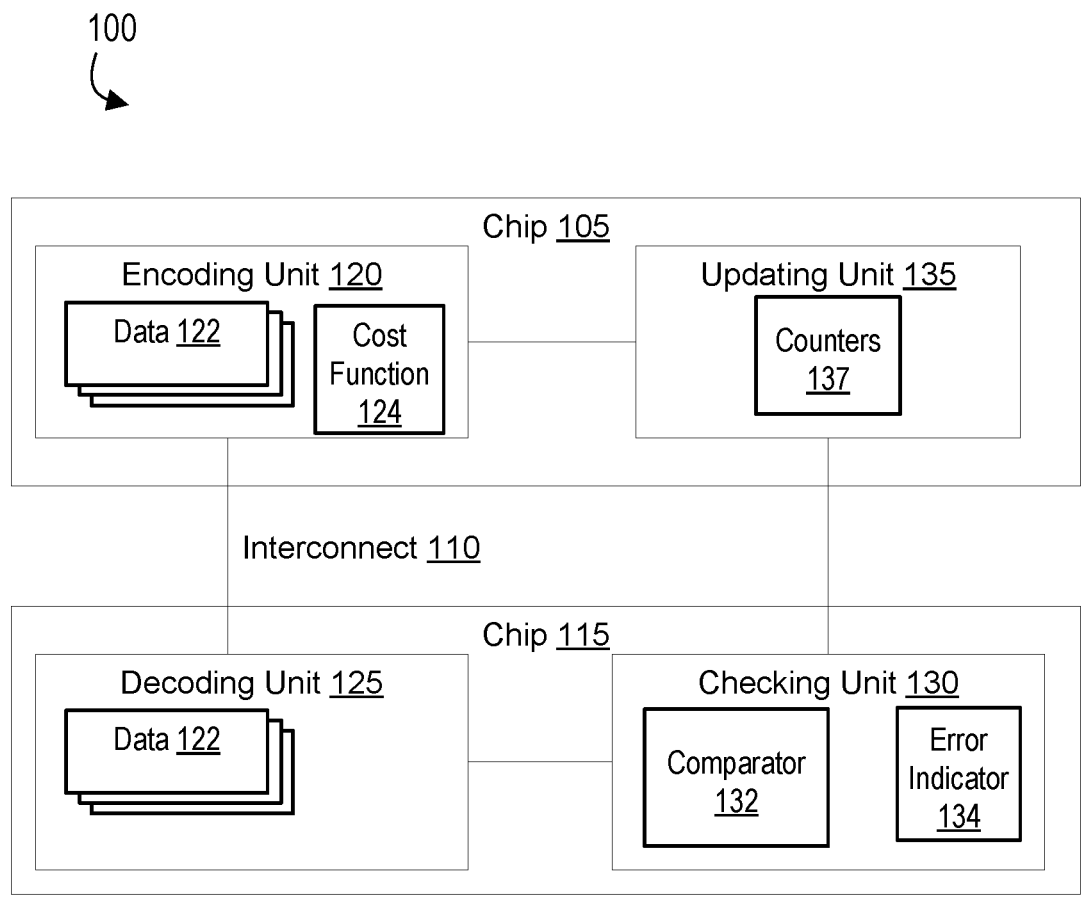
FIG. 1 is a block diagram of an example block diagram for data transmission mitigating interwire crosstalk according to some embodiments.

In some embodiments, a method for data transmission mitigating interwire crosstalk includes: dividing a data block to be transmitted from a transmitter to a receiver across a set of signal wires into sub-blocks; encoding each of the sub-blocks into a plurality of codewords; selecting, for each sub-block by a cost function, one of the codewords that is less likely to introduce interwire crosstalk; transmitting the selected codewords; and updating the cost function at the transmitter with feedback from the receiver.

In some embodiments, the plurality of codewords for each of the sub-blocks corresponds to specific functions. In some embodiments, transmitting the selected codewords includes applying an error correcting code to each selected codeword of the data block. In some embodiments, applying an error correcting code to each selected codeword further includes applying a truncated Hamming code (76,68) including 76 bits with 68 bits of data and 8 parity bits. In some embodiments, the method for data transmission mitigating interwire crosstalk further includes: receiving the selected codewords; correcting errors in the selected codewords using the error correcting code; and decoding each of the encoded codewords into the data block. In some embodiments, the method for data transmission mitigating interwire crosstalk further includes: detecting accuracy of the codewords; and updating the cost function at the transmitter with accuracy. In some embodiments, detecting accuracy of the codewords includes: checking the selected codewords for errors by comparing the selected codewords before correction using the error correcting code and the selected codewords after correction using the error correcting code; and updating an indicator for the codeword with an error based upon checking the selected codewords for errors. In some embodiments, updating an indicator for the codeword with an error includes incrementing a counter based upon the indicator for the codeword with an error. In some embodiments, the indicator for the codeword with an error indicates the specific function associated with the error, thereby tracking the errors associated with each specific function. In some embodiments, updating the cost function at the transmitter with accuracy includes consulting the counter when updating the cost function at the transmitter.

In some embodiments, an apparatus for data transmission mitigating interwire crosstalk performs steps including: dividing a data block to be transmitted from a transmitter to a receiver across a set of signal wires into sub-blocks; encoding each of the sub-blocks into codewords; and transmitting the codewords.

In some embodiments, transmitting the codewords includes applying an error correcting code to each codeword of the data block. In some embodiments, applying an error correcting code to each codeword further includes applying a truncated Hamming code (76,68) including 76 bits with 68 bits of data and 8 parity bits.

In some embodiments, an apparatus for data transmission mitigating interwire crosstalk performs steps including: dividing a data block to be transmitted from a transmitter to a receiver across a set of signal wires into sub-blocks; encoding each of the sub-blocks into a plurality of codewords; selecting, for each sub-block by a cost function, one of the codewords that is less likely to introduce interwire crosstalk; transmitting the selected codewords; and updating the cost function at the transmitter with feedback from the receiver.

In some embodiments, transmitting the selected codewords includes applying an error correcting code to each selected codewords of the data block. In some embodiments, the apparatus for data transmission mitigating interwire crosstalk further performs steps including receiving the selected codewords; correcting errors in the selected codewords using the error correcting code; and decoding each of the encoded codewords into the data block. In some embodiments, the apparatus for data transmission mitigating interwire crosstalk further performs steps including detecting accuracy of the codewords; and updating the cost function at the transmitter with accuracy. In some embodiments, the apparatus for data transmission mitigating interwire crosstalk performing the step of detecting accuracy of the codewords includes checking the selected codewords for errors by comparing the selected codewords before correction using the error correcting code and the selected codewords after correction using the error correcting code; and updating an indicator for the codeword with an error based upon checking the selected codewords for errors. In some embodiments, the apparatus with data transmission performing the step of updating an indicator for the codeword with an error includes incrementing a counter based upon the indicator for the codeword with an error. In some embodiments, the indicator for the codeword with an error indicates the specific function associated with the error, thereby tracking the errors associated with each specific function. In some embodiments, updating the cost function at the transmitter with accuracy includes consulting the counter at the receiver.

FIG. 1 is a block diagram of a non-limiting example 100. The example 100 can be implemented as a semiconductor chip package with interconnected chips or as multiple chips on multiple connected semiconductor chip packages. The device 100 includes a chip 105. The chip 105 is a compute chip. In some embodiments, the chip 105 can be a general processing chip or a specialized processing chip such as a graphics processing chip, hybrid processing chip, or other specialized processing chip. The chip 105 sends data over a bus or interconnect 110 to a chip 115. In some embodiments, the chip 115 can be a memory chip or another compute chip including a general processing chip or a specialized processing chip. In some embodiments, the chip 115 can be volatile storage such as Random Access Memory. In some embodiments, the chip 115 can be non-volatile storage such as flash storage, solid state disks, disk storage, and the like. In some embodiments, the chip 105 and chip 115 can be chips located on one semiconductor chip package or can be separate chips located near each other and in communication with each other by bus 110. In some embodiments, chip 115 is a memory chip and bus 110 is a standard Double Data Rate 4 Synchronous Dynamic Random-Access Memory (DDR4 SDRAM) interconnect with 80 wires.

The bus or interconnect 110 includes wires that carry bits of 0s and 1s. Adjacent wires are subject to crosstalk and potential errors in bits because of coupling. Crosstalk is correlated to opposing transitions on adjacent wires and is more likely when neighboring wires transition up from 0 to 1 or transition down from 1 to 0, and crosstalk is most likely when both neighboring wires transition up from 0 to 1 and transition down from 1 to 0. The data patterns of "010" and "101" have the highest likelihood of crosstalk in the middle wire. That is, in the data patterns of "010" and "101" the middle bit has the highest likelihood of incorrectly flipping to 0 or 1, respectively. The data patterns of "000" and "111" have the least likelihood of crosstalk in the middle wire. The data patterns of "010" and "101" may be called fully bad patterns, and the data patterns of "011" and "100" may be called partial bad patterns. Reducing partial or fully bad patterns will reduce errors in data transmission.

The chip 105 includes an encoding unit 120. The encoding unit 120 receives input data 122 in the form of a string of bits and produces a codeword. A Hamming code is then applied to the codeword that includes parity bits used in error correction and error detection. The information is then transmitted on interconnect 110. In some embodiments, the encoding unit 120 is part of a controller implemented in software or hardware.

In some embodiments, the encoding unit 120 receives input data 122 in the form of a data block as a string of bits and produces codewords. In a data block of a string of 64 bytes or 512 bits, the data block is divided into 16 32-bit sub-blocks. Three special functions are then applied to each 32-bit sub-block so that each 32-bit sub-block is encoded to four codewords, including a special function producing an unmodified codeword. The three special functions include, F1, out of every three bits, flipping the first bit; F2, out of every three bits, flipping the second bit; and F3, out of every three bits, flipping the third bit. The fourth special function, F0, includes flipping no bits. An example sub-block and four codewords is shown below, including F0, the unmodified codeword.

| F0 | 000 | 001 | 010 | 011 | 100 | 101 | 110 | 111 |
| F1 | 100 | 101 | 110 | 111 | 000 | 001 | 010 | 011 |
| F2 | 010 | 011 | 000 | 001 | 110 | 111 | 100 | 101 |
| F3 | 001 | 000 | 011 | 010 | 101 | 100 | 111 | 110 |

The encoding unit 120 applies a special function to each sub-block for each input data block. The encoding unit 120 divides each 32-bit data sub-block into 3-bit sub-blocks and then applies the special functions F0, F1, F2, and F3 to each of the data sub-blocks. Applying a special function to the sub-block results in a 32-bit interim codeword. The encoding unit 120 also adds two auxiliary bits that identify the special function applied to the sub-block. The interim codeword, with the appended (or prepended depending on the implementation) auxiliary bits that identify the special function applied to the sub-block, becomes a 34-bit codeword. That is, each of the codewords includes two auxiliary bits indicating which function has been applied. Thus, in some embodiments, each codeword is 34 bits in length.

The encoding unit 120 then applies a Hamming code to the codeword that includes bits used in error correction and error detection. A Hamming code encoding 120 data bits includes 7 parity bits for a total of 127 bits and is denoted Hamming (127, 120). Hamming codes have a minimum distance of 3, which means that the decoder can detect and correct a single error, but it cannot distinguish a double bit error of one codeword from a single bit error of a different codeword. Some double-bit errors will be incorrectly decoded as if they were single bit errors and will go undetected, unless no correction is attempted. To improve this error correction, Hamming codes can be extended by an extra parity bit. It is possible to increase the minimum distance of the Hamming code to 4, which allows the decoder to distinguish between single bit errors and two-bit errors. The decoder can then detect and correct a single error and at the same time detect a double error.

A truncated Hamming code can encode fewer data bits, typically 64 bits. In some embodiments, a truncated Hamming code encodes 68 data bits with 8 parity bits and is denoted Hamming (76, 68). As noted above, each codeword is 34 bits so two codewords are encoded using Hamming (76, 68). The encoded data is transmitted to chip 115 by interconnect 110. A truncated Hamming code encoding 68 data bits with 8 parity bits provides error correction capability up to four and protects both coded bits and auxiliary bits via error correction and codewords that tolerate up to three crosstalk errors.

The chip 115 includes a decoding unit 125. The decoding unit 125 receives the information and uses the Hamming code to check and correct errors. Then the codeword is decoded and the information 122 is stored or used by chip 115. In some embodiments, the decoding unit 125 is part of a controller implemented in software or hardware.

In some embodiments, the decoding unit 125 receives the information and uses the Hamming code to check and correct errors. The 8 parity bits are used to check and correct errors in the 68 data bits. Then the 68 data bits are decoded. Each 32-bit sub-block includes two auxiliary bits indicating which special function has been applied to the sub-block. The auxiliary bits specifying the special function applied to the codeword are used to decode the sub-block by reversing the particular special function. Each codeword is decoded and the data block is stored or used by chip 115.

The chip 115 also includes a checking unit 130. The checking unit 130 analyzes the information for errors and determines which codeword has been used. In some embodiments, the checking unit 130 is part of a controller implemented in software or hardware. In some embodiments, the checking unit 130 is part of the same controller as the decoding unit 125. In other embodiments, the checking unit 130 is part of a separate controller from the decoding unit 125 and is implemented in software or hardware.

In some embodiments, the checking unit 130 uses a comparator 132 to perform a bitwise comparison to compare the information received by chip 115 and the data after the Hamming code has detected and corrected errors. Any mismatch between the first 34 bits indicates an error in the first codeword and any mismatch between the second 34 bits indicates an error in the second codeword. The auxiliary bits indicating the special function are then used to determine which special function is associated with any errors. Information indicating the special function associated with an error is transmitted to chip 105 by interconnect 110. In some embodiments, the information can be sent in three bits including a 1-bit error signal and 2 bits for the particular auxiliary bits.

The chip 105 also includes an updating unit 135. The updating unit 135 receives information from the checking unit 130 indicating which codeword has errors and tracks the codewords and associated errors. In some embodiments, the updating unit 135 is part of a controller implemented in software or hardware. In some embodiments, the updating unit 135 is part of the same controller as the encoding unit 120. In other embodiments, the updating unit 135 is part of a separate controller from the encoding unit 120 and is implemented in software or hardware.

In some embodiments, the updating unit 135 receives information from the checking unit 130 indicating the special function associated with an error. In some embodiments, the information can be received in three bits including a 1-bit error signal and 2 bits for the particular auxiliary bits. The information is used to record the frequency of errors per each special function. In some embodiments, the updating unit 135 keeps four counters 137 for the special functions. In some embodiments, the updating unit 135 uses the 2 auxiliary bits received from the checking unit 130 to update the counter 137 corresponding to the particular special function by decrementing the counter 137. In some embodiments, the counters 137 corresponding to the other special functions are also incremented. For each data block transmitted, the counters 137 associated with the special functions are updated. In some embodiments, in an initialization step, all counters 137 are reset.

In some embodiments, the encoding unit 120 updates the cost function 124 by consulting with the updating unit 135 to receive the counter 137 with the maximum value of the four counters 137 for the corresponding special functions. The counter 137 with the maximum value indicates which special function has more recently been used. In some embodiments, the encoding unit 120 may give more weight to the corresponding special function when selecting data sub-blocks. In some embodiments, the encoding unit 120 may give weight to any counters 137 above a threshold and the corresponding special function when selecting data sub-blocks. In some embodiments, the encoding unit 120 may give weight to the counters in descending order and the corresponding special function when selecting data sub-blocks. In so doing, the encoding unit 120 selects the suitable codeword that is less likely to introduce interwire crosstalk and that minimizes the number of partial and fully bad patterns and mitigates interwire crosstalk. For further explanation, FIG. 2 sets forth a flow chart illustrating an exemplary method for data transmission that includes dividing 202 a data block to be transmitted from a transmitter to a receiver across a set of signal wires into sub-blocks. For example, in some embodiments, an encoding unit 120 as described in FIG. 1 divides a data block into sub-blocks. In some embodiments, the plurality of codewords for each of the sub-blocks corresponds to specific functions.

Figure 2:
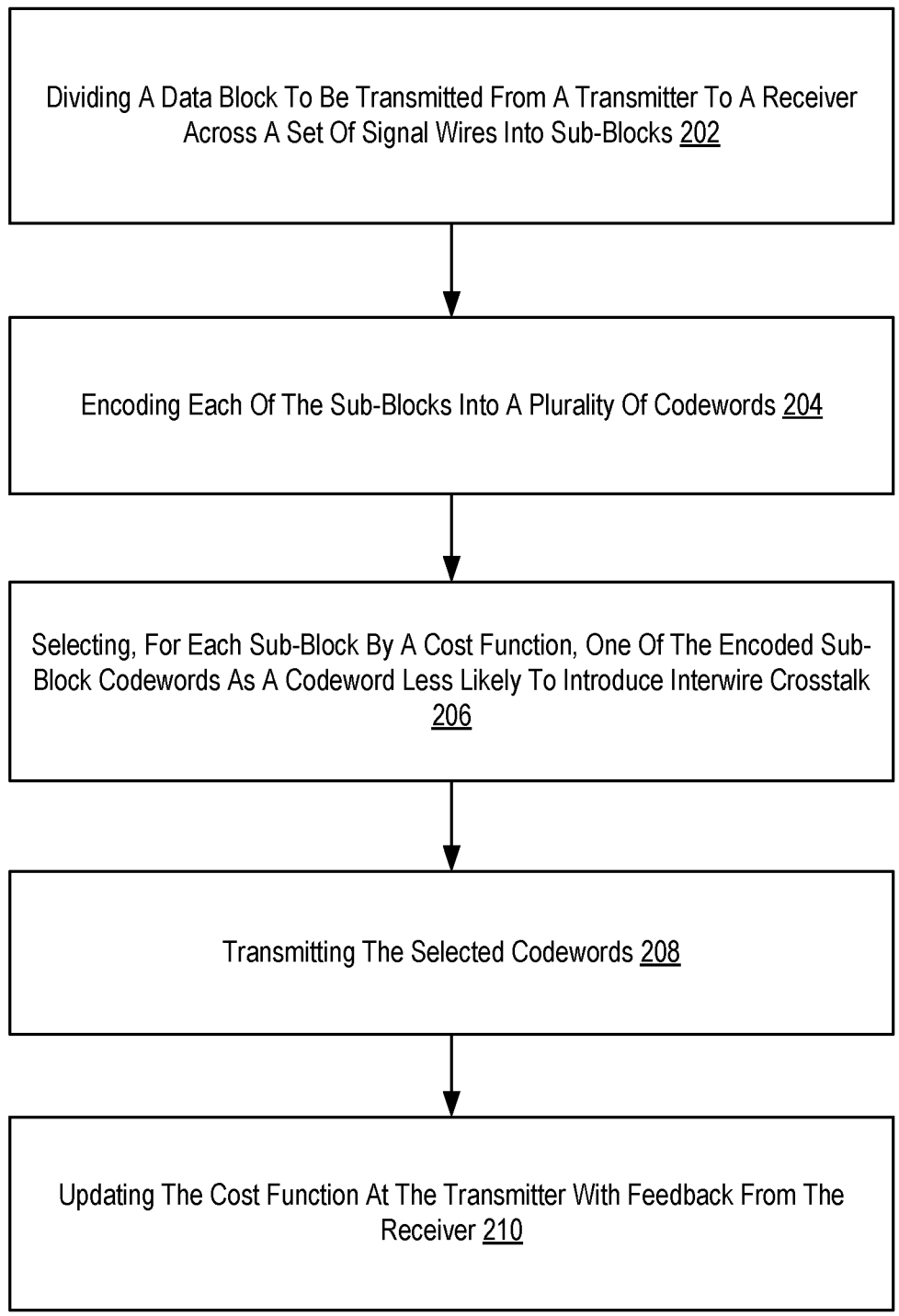
FIG. 2 is a flowchart of an example method for data transmission mitigating interwire crosstalk according to some embodiments.

The method of FIG. 2 also includes encoding 204 each of the sub-blocks into a plurality of codewords. In some embodiments, two 32-bit groups of sub-blocks are encoded to multiple codewords. In some embodiments, the multiple codewords correspond to multiple specific functions. In some embodiments, the multiple codewords include two auxiliary bits that indicate the corresponding specific function.

The method of FIG. 2 also includes selecting 206, for each sub-block by a cost function, one of the codewords that is less likely to introduce interwire crosstalk (relative to the other codewords encoded for the sub-block). Selecting 206 one of the encoded sub-block codewords that is less likely to introduce interwire crosstalk includes selecting from among the multiple interim codewords corresponding to the respective specific functions. Selecting from among the multiple interim codewords corresponding to the respective specific functions is made using the cost function 124 that receives information from the updating unit 135 and the checking unit 130. In some embodiments, the cost function 124 indicates which interim codeword corresponding to a specific function is less (or least) likely to introduce interwire crosstalk. In some embodiments, the cost function 124 indicates which specific function produces no partial or fully bad patterns. In some embodiments, the cost function 124 indicates which specific function produces no fully bad patterns. In some embodiments, the cost function 124 indicates which specific functions are less likely to introduce interwire crosstalk. In some embodiments, the cost function 124 refers to the counters 137 in the updating unit 135. The cost function 124 selects the specific function with the highest counter or selects any specific function above a threshold as less likely to introduce interwire crosstalk. In some embodiments, the cost function 124 may give weight to the counters 137 in descending order and the corresponding special function when selecting from among the multiple interim codewords.

The method of FIG. 2 also includes transmitting 208 the selected codewords. Transmitting 208 the selected codewords includes transmitting the selected codewords from the transmitter to the receiver across the set of signal wires. In some embodiments, transmitting 208 the selected codewords includes transmitting the selected codewords from chip 105 to chip 115 via interconnect or bus 110. In some embodiments, transmitting 208 the selected codewords also includes applying an error correcting code to each selected codeword of the data block. In some embodiments, applying an error correcting code to each selected codeword of the data block includes applying a truncated Hamming code (76,68) including 76 bits with 68 bits of data and 8 parity bits to the selected codewords.

The method of FIG. 2 also includes updating 210 the cost function at the transmitter with feedback from the receiver. Updating 208 the cost function at the transmitter with feedback from the receiver includes receiving information from the receiver indicating which codewords and corresponding specific functions have an error during transmission and is described in more detail hereinbelow.

Figure 3:
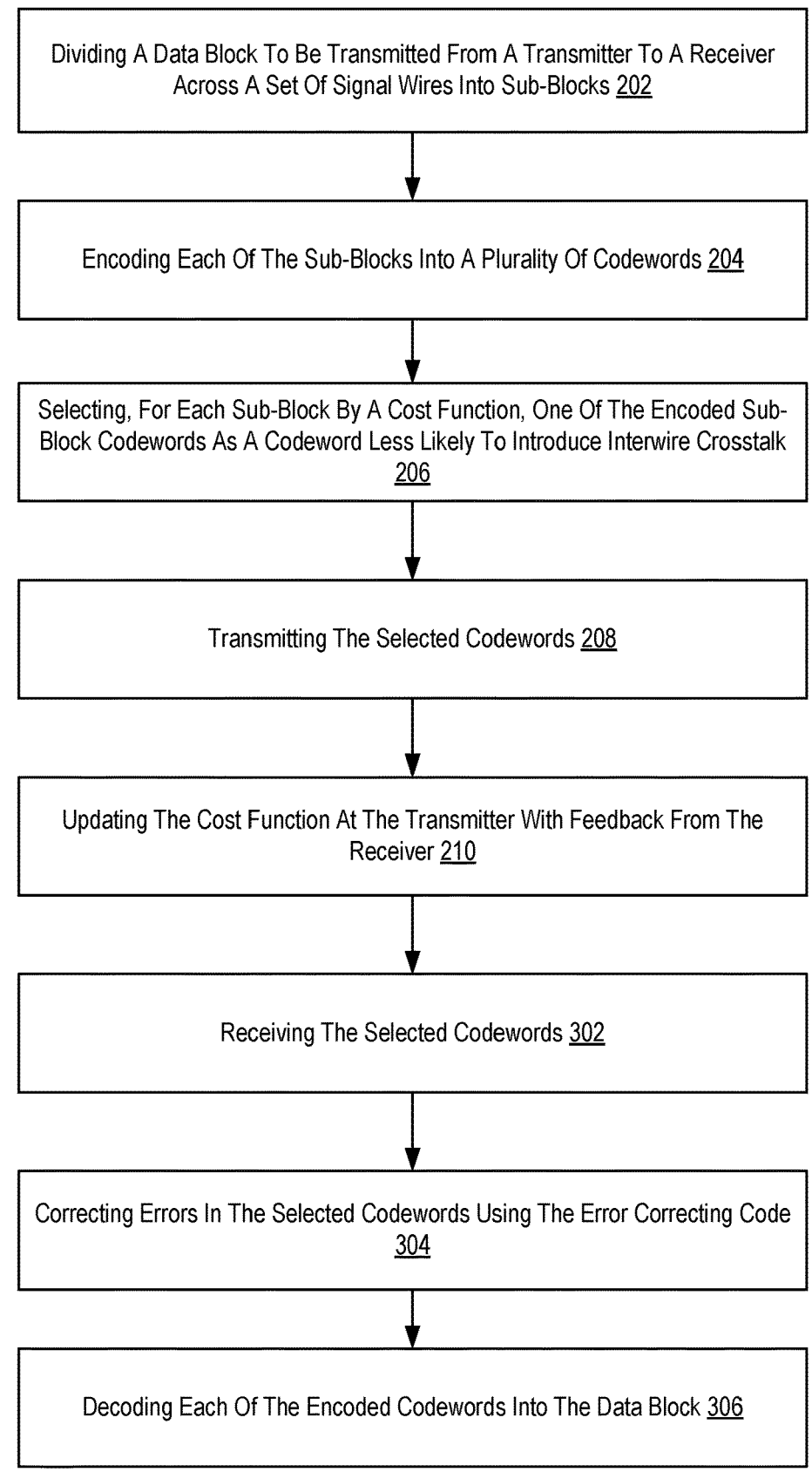
FIG. 3 is a flowchart of an example method for data transmission mitigating interwire crosstalk according to some embodiments.

For further explanation, FIG. 3 sets forth a flow chart illustrating an exemplary method for data transmission that includes dividing 202 a data block to be transmitted from a transmitter to a receiver across a set of signal wires into sub-blocks; encoding 204 each of the sub-blocks into a plurality of codewords; selecting 206 for each sub-block by a cost function, one of the codewords that is less likely to introduce interwire crosstalk; transmitting 208 the selected codewords; and updating 210 the cost function at the transmitter with feedback from the receiver.

The method of FIG. 3 differs from FIG. 2 in that the method of FIG. 3 includes receiving 302 the selected codewords. Receiving 302 the selected codewords includes receiving the selected codewords at the receiver. In some embodiments, the chip 115 receives the codewords via interconnect or bus 110.

The method of FIG. 3 further differs from FIG. 2 in that the method of FIG. 3 includes correcting 304 errors in the selected codewords using the error correcting code. Correcting 304 errors in the selected codewords using the error correcting code includes using the error correcting code to check and correct errors in the received selected codewords. In some embodiments, correcting 304 errors in the selected codewords using the error correcting code includes using truncated Hamming code (76,68) including 76 bits with 68 bits of coded data and 8 parity bits to check and correct errors in the received data.

The method of FIG. 3 further differs from FIG. 2 in that the method of FIG. 3 includes decoding 306 each of the encoded codewords into the data block. Decoding 306 each of the encoded codewords into the data block includes reversing the encoding of the data to the codeword. In some embodiments, each of the plurality of codewords corresponds to a specific function applied to each of the sub-blocks and auxiliary bits indicate the specific function. In some embodiments, decoding the data includes reversing the specific function applied to each of the sub-blocks resulting in the original data block 122.

Figure 4:
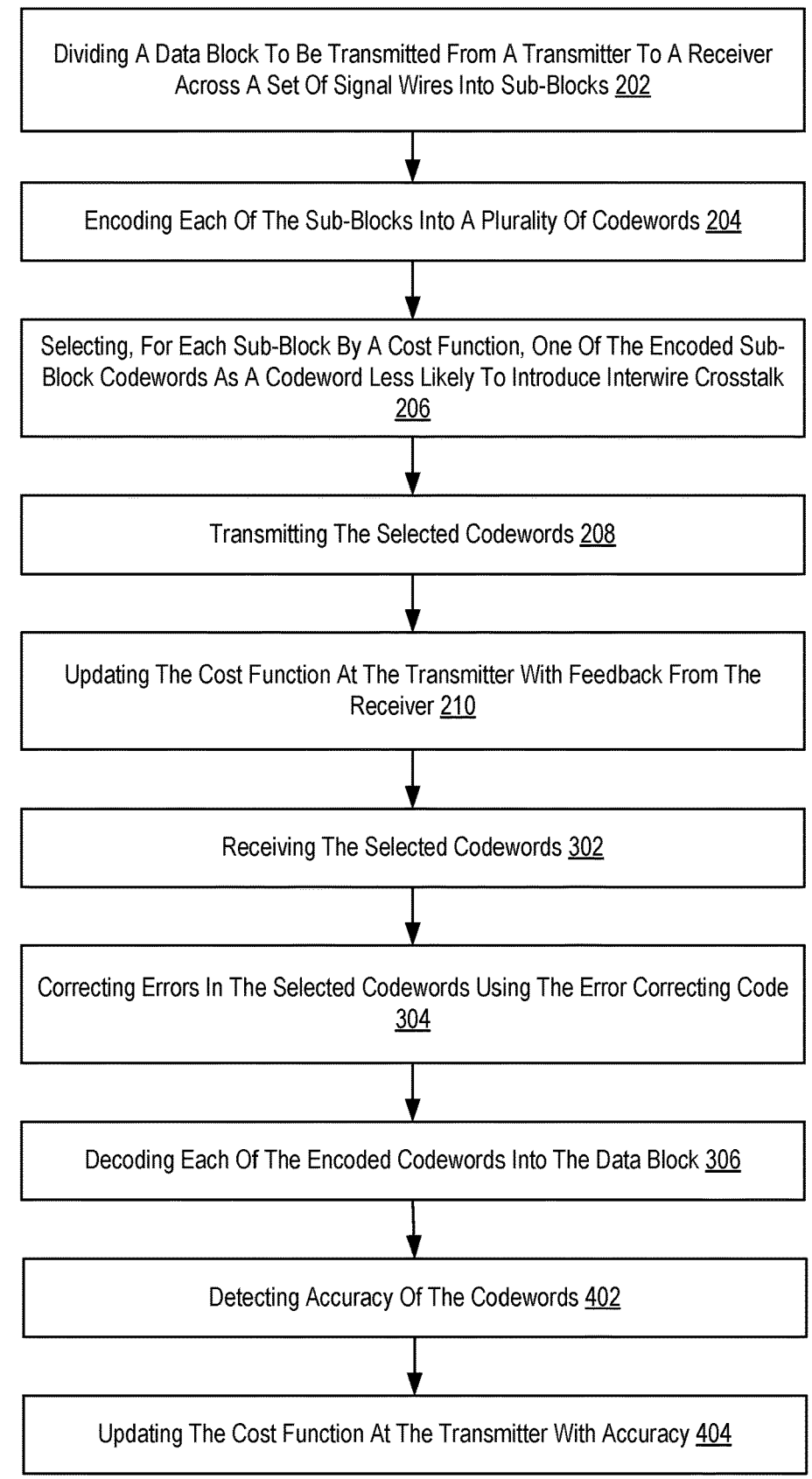
FIG. 4 is a flowchart of an example method for data transmission mitigating interwire crosstalk according to some embodiments.

For further explanation, FIG. 4 sets forth a flow chart illustrating an exemplary method for data transmission that includes dividing 202 a data block to be transmitted from a transmitter to a receiver across a set of signal wires into sub-blocks; encoding 204 each of the sub-blocks into a plurality of codewords; selecting 206 for each sub-block by a cost function, one of the codewords that is less likely to introduce interwire crosstalk; transmitting 208 the selected codewords; updating 210 the cost function at the transmitter with feedback from the receiver; receiving 302 the selected codewords; correcting 304 errors in the selected codewords using the error correcting code; and decoding 306 each of the encoded codewords into the data block.

The method of FIG. 4 differs from FIGS. 2 and 3 in that the method of FIG. 4 includes detecting 402 accuracy of the codewords. Detecting 402 accuracy of the codewords includes checking the selected codewords for errors by comparing the selected codewords before correction using the error correcting code and the selected codewords after correction using the error correcting code. Detecting 402 accuracy of the codewords also includes updating an indicator for the codeword with an error based upon checking the selected codewords for errors. In some embodiments, updating an indicator for the codeword with an error includes incrementing a counter based upon the indicator for the codeword with an error. In some embodiments, the indicator for the codeword with an error indicates the specific function associated with the error, thereby tracking the errors associated with each specific function.

The method of FIG. 4 differs from FIGS. 2 and 3 in that the method of FIG. 4 includes updating 404 the cost function at the transmitter with accuracy. Updating 404 the cost function at the transmitter with accuracy includes consulting the counter when updating the cost function at the transmitter. In some embodiments, consulting the counter 137 when updating the cost function 124 at the transmitter includes determining the counter 137 with the maximum value of the four counters for the corresponding special functions. In some embodiments, the counter 137 with the maximum value indicates which special function has more recently been used. In some embodiments, the counter 137 with the maximum value may receive greater weight to the corresponding special function when updating the cost function 124 with accuracy. In some embodiments, the cost function 124 may give weight to any counters 137 above a threshold and the corresponding special function when selecting data sub-blocks. In some embodiments, the cost function 124 may give weight to the counters 137 in descending order and the corresponding special function when selecting data sub-blocks. In so doing, suitable codewords that are less likely to introduce interwire crosstalk and that minimize the number of partial and fully bad patterns and mitigates interwire crosstalk may be selected.

In view of the explanations set forth above, readers will recognize that the benefits of data transmission carried out according to embodiments of the present disclosure include:
  mitigating interwire crosstalk by a computationally efficient approach for reducing crosstalk errors in data transmission including in high bandwidth data transport over buses,
  providing error correction capability for up to four errors for mitigating inter-wire crosstalk, and
  mitigating interwire crosstalk efficiently in terms of power, performance and area overheads.

Exemplary embodiments of the present disclosure are described largely in the context of a fully functional computer system for data transmission mitigating interwire crosstalk. Readers of skill in the art will recognize, however, that the present disclosure also can be embodied in a computer program product disposed upon computer readable storage media for use with any suitable data processing system. Such computer readable storage media can be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present disclosure.

The present disclosure can be a system, a method, or a computer program product. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network or a wireless network. The network can include copper transmission cables, optical transmission fibers, wireless transmission, routers, firewalls, switches, gateway computers or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations or block diagrams of methods, apparatus (systems), and computer program products according to embodiments of the disclosure. It will be understood that each block of the flowchart illustrations or block diagrams, and combinations of blocks in the flowchart illustrations or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart or block diagram block or blocks. These computer readable program instructions can also be stored in a computer readable storage medium that can direct a computer, a programmable data processing apparatus, or other devices to function in a particular manner, such that the computer readable storage medium having instructions stored therein includes an article of manufacture including instructions which implement aspects of the function/act specified in the flowchart or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams or flowchart illustration, and combinations of blocks in the block diagrams or flowchart illustration, can be implemented by special purpose hardware-based systems that perform the specified functions or acts or carry out combinations of special purpose hardware and computer instructions.

It will be understood from the foregoing description that modifications and changes can be made in various embodiments of the present disclosure. The descriptions in this specification are for purposes of illustration only and are not to be construed in a limiting sense. The scope of the present disclosure is limited only by the language of the following claims.

What is claimed is:

1. A method comprising:
dividing a data block to be transmitted to a receiver across a set of signal wires into sub-blocks;
encoding each of the sub-blocks into a plurality of codewords;
selecting, for each sub-block, one of the codewords that is less likely to introduce interwire crosstalk based on a cost function;
transmitting the selected codewords; and
updating the cost function with feedback from the receiver.

2. The method of claim 1, wherein the plurality of codewords for each of the sub-blocks corresponds to specific functions.

3. The method of claim 2, wherein each of the plurality of codewords include two auxiliary bits that indicate the corresponding specific function.

4. The method of claim 1, wherein transmitting the selected codewords comprises applying an error correcting code to each selected codeword of the data block.

5. The method of claim 4, wherein applying an error correcting code to each selected codeword further comprises applying a truncated Hamming code (76,68) including 76 bits with 68 bits of data and 8 parity bits.

6. The method of claim 4, further comprising:
receiving the selected codewords;
correcting errors in the selected codewords using the error correcting code; and
decoding each of the encoded codewords into the data block.

7. The method of claim 6, further comprising:
detecting accuracy of the codewords; and
updating the cost function with accuracy.

8. The method of claim 7, wherein detecting accuracy of the codewords comprises:
checking the selected codewords for errors by comparing the selected codewords before correction using the error correcting code and the selected codewords after correction using the error correcting code; and
updating an indicator for the codeword with an error based upon checking the selected codewords for errors.

9. The method of claim 8, wherein updating an indicator for the codeword with an error comprises incrementing a counter based upon the indicator for the codeword with an error.

10. The method of claim 8, wherein the indicator for the codeword with an error indicates the specific function associated with the error, thereby tracking the errors associated with each specific function.

11. The method of claim 9, wherein updating the cost function with accuracy comprises consulting the counter when updating the cost function.

12. An apparatus comprising:
an encoding unit an an updating unit, the encoding unit comprising logic to:
divide a data block to be transmitted to a receiver across a set of signal wires into sub-blocks;
encode each of the sub-blocks into a plurality of codewords;
select, for each sub-block, one of the codewords that is less likely to introduce interwire crosstalk nased on a cost function; and
transmit the selected codewords,
wherein the updating unit comprses logic to update the cost function with feedback from a receiver.

13. The apparatus of claim 12, wherein transmitting the selected codewords comprises applying an error correcting code to each selected codeword of the data block.

14. The apparatus of claim 13, further comprising a decoding unit comprising logic to:
receive the selected codewords;
correct errors in the selected codewords using the error correcting code; and
decode each of the encoded codewords into the data block.

15. The apparatus of claim 14, further comprising a a checking unit comprising logic to:
detect accuracy of the codewords; and
update the cost function with accuracy.

16. The apparatus of claim 15, wherein detecting accuracy of the codewords comprises:
checking the selected codewords for errors by comparing the selected codewords before correction using the error correcting code and the selected codewords after correction using the error correcting code; and
updating an indicator for the codeword with an error based upon checking the selected codewords for errors.

17. The apparatus of claim 16, wherein updating an indicator for the codeword with an error comprises incrementing a counter based upon the indicator for the codeword with an error.

18. The apparatus of claim 17, wherein updating the cost function with accuracy comprises consulting the counter at the receiver.

19. The apparatus of claim 16, wherein the indicator for the codeword with an error indicates the specific function associated with the error, thereby tracking the errors associated with each specific function.

20. The apparatus of claim 12, wherein the plurality of codewords for each of the sub-blocks corresponds to specific functions.

21. The apparatus of claim 20, wherein each of the plurality of codewords include two auxiliary bits that indicate the corresponding specific function.

* * * * *